(12) United States Patent
Toro-Lira et al.

(10) Patent No.: US 7,012,583 B2
(45) Date of Patent: Mar. 14, 2006

(54) APPARATUS AND METHOD FOR TESTING PIXELS OF FLAT PANEL DISPLAY

(75) Inventors: Guillermo Toro-Lira, Sunnyvale, CA (US); David Baker, San Jose, CA (US)

(73) Assignee: Shimadzu Corporation, Kyoto (JP)

( * ) Notice: Subject to any disclaimer, the term of this patent is extended or adjusted under 35 U.S.C. 154(b) by 136 days.

(21) Appl. No.: 10/360,223

(22) Filed: Feb. 7, 2003

(65) Prior Publication Data

US 2004/0155838 A1  Aug. 12, 2004

(51) Int. Cl.
G09G 3/20 (2006.01)

(52) U.S. Cl. .................................... 345/75.2

(58) Field of Classification Search ............... 345/904, 345/75, 74.1, 75.2; 324/765, 751, 770, 501; 257/66; 250/221
See application file for complete search history.

(56) References Cited

U.S. PATENT DOCUMENTS

| | | | | |
|---|---|---|---|---|
| 5,724,107 A * | 3/1998 | Nishikawa et al. | ............ | 349/38 |
| 5,751,262 A * | 5/1998 | Browning et al. | .......... | 345/75.2 |
| 5,757,193 A * | 5/1998 | Yu et al. | ..................... | 324/501 |
| 5,844,249 A * | 12/1998 | Takano et al. | ........... | 356/237.1 |
| 5,982,190 A | 11/1999 | Toro-Lira | | |
| 6,033,281 A | 3/2000 | Toro-Lira | | |
| 6,075,245 A | 6/2000 | Toro-Lira | | |
| 6,429,835 B1 * | 8/2002 | Browning et al. | .......... | 345/74.1 |
| 6,450,469 B1 * | 9/2002 | Okuno | .................. | 248/346.01 |
| 6,504,393 B1 * | 1/2003 | Lo et al. | ...................... | 324/765 |
| 6,556,265 B1 * | 4/2003 | Murade | ...................... | 349/111 |
| 6,657,230 B1 * | 12/2003 | Murade | ....................... | 257/72 |
| 6,873,175 B1 * | 3/2005 | Toro-Lira et al. | ........... | 324/770 |
| 6,935,913 B1 * | 8/2005 | Wyeth et al. | .................. | 445/3 |
| 2002/0088940 A1 * | 7/2002 | Watanabe et al. | ........... | 250/310 |
| 2003/0170613 A1 * | 9/2003 | Straus | ............................ | 435/5 |
| 2003/0179007 A1 * | 9/2003 | Nozoe et al. | ............... | 324/754 |
| 2003/0218171 A1 * | 11/2003 | Isobe et al. | ................... | 257/64 |
| 2004/0004218 A1 * | 1/2004 | Jinno | ........................... | 257/66 |
| 2004/0032278 A1 * | 2/2004 | Orii et al. | .................... | 324/765 |

OTHER PUBLICATIONS

U.S. Appl. No. 10/355,757, Pallet Assembly for Substrate Inspection Device and Substrate Inspection Device, Filing Date: Jan. 31, 2003.

* cited by examiner

Primary Examiner—Vijay Shankar
Assistant Examiner—Prabodh Dharia
(74) Attorney, Agent, or Firm—Rankin, Hill, Porter & Clark LLP

(57) ABSTRACT

An apparatus for testing pixels of a flat panel display has a palette for holding a TFT substrate, drive signal source units, and predetermined voltage source units. The palette is grounded. One of the predetermined voltage source units applies a predetermined voltage to a Cs electrode of each of pixels constituting the TFT substrate so that the predetermined voltage is used as a reference voltage of the TFT substrate 11. The drive signal source units supply drive signals to a gate electrode G and a source electrode S respectively in each of the pixels constituting the TFT substrate. The voltages of the drive signals are floated by predetermined voltages given by the corresponding predetermined voltage source units respectively.

12 Claims, 7 Drawing Sheets

APPARATUS AND METHOD FOR TESTING PIXELS OF FLAT PANEL DISPLAY

BACKGROUND OF THE INVENTION

1. Field of the Invention

The present invention relates to an apparatus and method for testing pixels of a flat panel display.

2. Description of the Related Art

A flat panel display (FPD) is a display device for displaying electronic information. An example of the flat panel display (FPD) popularly used in the recent years is a liquid crystal display (LCD) using thin film transistors (TFTs). The liquid crystal display using the TFTs is used in a high-performance laptop computer or the like.

The configuration and operation of the liquid crystal display using the TFTs will be described below. As the basic structure, the liquid crystal display using the TFTs has a liquid crystal panel formed in such a manner that liquid crystal is poured between one glass substrate having TFTs and pixel electrodes formed thereon and the other glass substrate having counter electrodes formed thereon.

FIG. 5 is a schematic view showing a glass substrate on which TFTs and pixel electrodes are formed. In FIG. 5, a single glass substrate 11 has a plurality of panels 12 formed by a general process of manufacturing integrated circuits. Each of the panels 12 is constituted by a plurality of pixels 13 arranged in a matrix layout.

Each of the pixels 13 contains a pixel electrode 14, a storage capacitor 15, and a TFT 16. The pixel electrode 14 is made of a light-transmissive material. Generally, the pixel electrode 14 is made of ITO (indium tin oxide). The storage capacitor 15 has an electrode (hereinafter referred to as "Cs electrode") to which a reference voltage of the pixel 13 is applied. The Cs electrode is grounded. That is, the reference voltage of each TFT 16 is set at a ground level. The TFT 16 functions as a switch. The TFT 16 has a gate electrode G supplied with a row selection signal $L_R$ for performing switching control, and a source electrode S supplied with a column selection signal $L_C$ as a data signal.

When a voltage $V_G$ is applied to the gate electrode G of the TFT 16 (i.e., a row selection signal $L_R$ is supplied) while a voltage $V_S$ is applied to the source electrode S of the TFT 16 (i.e., a column selection signal $L_C$ is supplied) at the time of driving of each pixel 13, the TFT 16 is switched on to increase a drain voltage $V_D$. During that time, the storage capacitor 15 is charged to maintain the drain voltage $V_D$ until the next refreshing cycle. By repeating this process to all the pixels 13, the molecular arrangement of liquid crystal between the two glass substrates is controlled so that a two-dimensional image is displayed on the liquid crystal display.

For testing the glass substrate having TFTs and pixel electrodes formed thereon (hereinafter referred to as "TFT substrate"), there has been proposed a method for non-contact judgment of each pixel condition on the substrate on the basis of a voltage contrast technique using an electron beam (U.S. Pat. No. 5,982,190). The TFT substrate testing method using the voltage contrast technique has an advantage that this method is more inexpensive than any related-art testing method using a mechanical probing technique and is higher in testing speed than any optical testing method.

FIG. 6 is a drawing for explaining a TFT substrate testing method using a voltage contrast technique. This testing method is carried out in a high-vacuum chamber. A TFT substrate to be tested is carried into the high-vacuum chamber and disposed on a stage. In this condition, the TFT substrate is tested.

In FIG. 6, the testing apparatus includes an electron beam source 21, a secondary electron detector 24, and a signal analyzer (computer system or the like) 25. The electron beam source 21 generates an electron beam 22 with which each pixel 13 of the TFT substrate 11 is irradiated. The secondary electron detector 24 detects secondary electrons 23 generated on the basis of irradiation of each pixel 13 of the TFT substrate 11 with the electron beam 22. The secondary electron detector 24 outputs a signal indicating a waveform corresponding to the voltage waveform of the pixel 13 on the basis of the amount of the detected secondary electrons 23 and sends the signal to the signal analyzer 25. The signal analyzer 25 analyzes the output signal of the secondary electron detector 24 and checks each pixel condition, especially the presence/absence of a defect in the pixel and the details of the defect. The signal analyzer 25 includes a drive signal supply unit by which drive signals for driving each pixel 13 of the TFT substrate 11 is output through lines 26. Supply of the drive signals is synchronized with scanning of the TFT substrate 11 using the electron beam 22 generated by the electron beam source 21 in directions represented by the arrows S in FIG. 6.

The principle of the voltage contrast technique based on the amount of detected secondary electrons will be described below.

The amount of secondary electrons 23 emitted from each pixel 13 of the TFT substrate 11 depends on the polarity of the voltage of the pixel 13 of the TFT substrate 11. When, for example, a pixel 13 in the TFT substrate 11 is driven positively, secondary electrons 23 emitted on the basis of irradiation of the pixel 13 with an electron beam 22 are attracted to the pixel 13 because the secondary electrons 23 have negative electric charges. As a result, the amount of the secondary electrons 23 reaching the secondary electron detector 24 is reduced.

On the other hand, when a pixel 13 in the TFT substrate 11 is driven negatively, secondary electrons 23 emitted on the basis of irradiation of the pixel 13 with an electron beam 22 repel the pixel 13 because the secondary electrons 23 have negative electric charges. As a result, the secondary electrons 23 emitted from the pixel 13 reach the secondary electron detector 24 without reduction in the amount of the secondary electrons 23.

In this manner, the voltage signal waveform of the pixel 13 can be measured on the basis of the fact that the amount of the detected secondary electrons 23 emitted from the pixel 13 depends on the polarity of the voltage of the pixel 13.

In such a test, a method of molding a TFT substrate between a palette for holding the TFT substrate and a prober frame for applying a TFT driving voltage has been proposed in U.S. Pat. No. 6,765,203 to solve the problem that damage of the apparatus in a high-vacuum chamber is caused by breaking of the glass substrate in the high-vacuum chamber.

FIGS. 7A and 7B are perspective views showing a mode in which the TFT substrate is held between the palette for holding the TFT substrate and the prober frame for applying a TFT driving voltage. In this here, description is made on the case where a glass substrate having two panels 12 formed thereon is used as the TFT substrate 11, as shown in FIG. 7A.

In FIGS. 7A and 7B, the testing apparatus includes a palette 41 for holding the TFT substrate 11, and a prober 44 for supplying drive signals to each of pixels 13 on the TFT substrate 11.

The palette 41 has electrodes (not shown) formed on a stage 45 side and brought into contact with a power distribution portion 46 of the stage 45 opposite to the palette 41, a power distribution portion 42 provided on the prober 44 side and brought into contact with electrodes (not shown) of the prober 44, and a flexible circuit 43 to connect the two power distribution portions 46 and 42 to each other.

The prober 44 is shaped so that a glass portion except a panel 12-formed region of the TFT substrate 11 opposite to the prober 44 is covered with the prober 44. For example, in FIG. 7A, the prober 44 is shaped like a frame that surrounds the two panels 12 formed on the glass substrate. The prober 44 has electrodes (not shown) formed on the palette 41 side and brought into contact with the power distribution portion 42 of the palette 41, and prober pins (not shown) brought into contact with electrodes which are provided on the glass substrate opposite to the prober 44 and which are connected to the panels. The prober pins are connected to the electrodes formed on the palette 41 side of the prober 44 through wiring so that voltages from the electrodes formed on the palette 41 are applied to the electrodes provided on the glass substrate from the probe pins. Incidentally, the prober pins and the electrodes are mounted on the prober 44 through an electrically insulating material such as ceramics.

The palette 41 and the prober 44 are tightened to each other by fixing stutts such as bolts. Between the palette 41 and the prober 44 after assembling in this manner, the TFT substrate 11 is inserted and held (FIG. 7B).

For testing, the TFT substrate 11 held between the palette 41 and the prober 44 is carried into a high-vacuum chamber and sat on the stage 45. In the high-vacuum chamber, an apparatus control unit supplies a driving voltage to the electrodes of the prober 44 through the power distribution portion 46 of the stage 45 and the flexible circuit 43 and power distribution portion 42 of the palette 41 in a testing process. The prober pins of the prober 44 supply drive signals to the pixels 13 of the TFT substrate 11 through the electrodes on the glass substrate. On this occasion, the palette 41 (and the prober 44) is grounded to be electrically insulated in the high-vacuum chamber.

In the testing apparatus configured as described above, even in the case where the glass substrate of the TFT substrate 11 in the high-vacuum chamber is broken, broken pieces of glass is not scattered over the stage and other devices in the chamber because the broken pieces remain on the palette 41. Hence, the broken pieces can be collected smoothly, so that damage of the apparatus caused by scattering of the broken pieces can be minimized. Further, because the glass portion of the TFT substrate 11 is covered with the prober 44, drive signals can be supplied to the respective pixels 13 while the glass portion is prevented from being negatively charged (charged-up) on the basis of the electron beam 22.

In the testing apparatus configured as described above, there is however a voltage difference between the prober 44 and a pixel 13 driven near the prober 44. Hence, there is a problem that efficiency in detection of secondary electrons emitted from the driven pixel 13 is lowered by the voltage difference. The influence of the voltage difference between the pixel 13 and the prober 44 on the amount of detected secondary electrons will be described below with reference to FIGS. 8, 9A and 9B.

FIG. 8 is a schematic drawing showing the testing apparatus using the pallet and the prober. Specifically, FIG. 8 shows apart of the palette 41 (and the prober 44) of the TFT substrate 11 and its vicinity.

In FIG. 8, the testing apparatus includes a palette 41 (and a prober 44), and drive signal source units 51 and 52 for supplying drive signals to each pixel. The prober 44 is integrated with the palette 41. The drive signal source units 51 and 52 supply drive signals to the source electrode S and the gate electrode G respectively through the prober 44.

In a testing process, the Cs electrode of each pixel and the palette 41 (and the prober 44) are grounded and the drive signal source units 51 and 52 supply drive signals to the source electrode S and the gate electrode G respectively in each pixel. Referring back to FIG. 6, each pixel 13 is driven positively or negatively in accordance with the drive signals, and then the pixel 13 is irradiated with an electron beam generated from the electron beam source 21. Secondary electrons 23 emitted from the pixel 13 irradiated with the electron beam are detected by the secondary electron detector 24 (see FIG. 6). The amount of the secondary electrons detected by the secondary electron detector 24 varies in accordance with the voltage difference between the driven pixel 13 and the prober 44 (and the palette 41) as shown in FIGS. 9A and 9B and as follows.

FIGS. 9A and 9B are schematic drawings for explaining the trajectory of secondary electrons in accordance with the voltage (of each pixel 13) of the TFT substrate 11.

When the TFT substrate 11 is driven positively (e.g., the pixel 13 voltage of the TFT substrate 11 is +5 V) as shown in FIG. 9A, the pixel 13 voltage of the TFT substrate 11 becomes higher than the voltage of the grounded prober 44 (and the palette 41) (i.e., the voltage of the prober 44 is 0 V). Accordingly, secondary electrons 61 emitted from the pixel near the prober 44 rebound from the vicinity of the prober and are effectively detected by the secondary electron detector.

On the other hand, when the TFT substrate 11 is driven negatively (the pixel 13 voltage of the TFT substrate 11 is −5 V) as shown in FIG. 9B, the pixel 13 voltage of the TFT substrate 11 becomes lower than the voltage of the grounded prober 44 (and the palette 41) (i.e., the voltage of the prober 44 is 0 V). Accordingly, secondary electrons 61' emitted from the pixel near the prober 44 are partially attracted and absorbed to the prober. In this case, the amount of secondary electrons 61' emitted from a pixel near the prober and detected by the secondary electron detector is smaller than the amount of secondary electrons emitted from a pixel located in the central portion of the TFT substrate 11 and detected by the secondary electron detector. Hence, in a detected image obtained on the basis of the amount of secondary electrons detected by the secondary electron detector, there is a problem that the portion near the prober is mistaken to be a detected pixel, for example, the amount of detected secondary electrons emitted from a pixel near the prober is smaller than a reference value for detection of a pixel defect.

SUMMARY OF THE INVENTION

An object of the invention is to provide an apparatus and method for testing pixels of a flat panel display so that the respective pixels in the whole test region can be tested uniformly and accurately independent of the position in the region.

In order to achieve the object, according to the invention, there is provided an apparatus for testing pixels of a flat panel display, comprising: an electron beam source for irradiating the flat panel display with an electron beam; a secondary electron detector for detecting secondary electrons emitted from each of the pixels of the flat panel display irradiated with the electron beam; a holding member for holding the flat panel display; and a voltage source unit for applying a first predetermined voltage to either the holding member or an electrode of a storage capacitor contained in each pixel in a condition that a reference voltage of the pixel is applied to the electrode of the storage capacitor.

Preferably, the holding member has a palette for putting the flat panel display on its upper surface, and a prober for supplying a drive signal to each pixel to drive the TFT to a predetermined voltage.

In the apparatus for testing pixels of a flat panel display, preferably, the voltage source unit applies the first predetermined voltage as a plus value to the electrode of the storage capacitor. Further preferably, the voltage source unit applies the first predetermined voltage as a plus value to a data signal input terminal of a transistor contained in each pixel and to a switching control signal input terminal of the transistor.

In addition, in the apparatus for testing pixels constituting a flat panel display, preferably, the voltage source unit applies the first predetermined voltage as a minus value to the holding member.

According to the testing apparatus configured as described above, the flat panel display is irradiated with an electron beam generated by the electron beam source. Secondary electrons emitted from each of the pixels of the flat panel display by irradiation with the electron beam are detected by the secondary electron detector. In addition, the voltage source unit applies a first predetermined voltage to either the holding member to hold the flat panel display or the electrode of the storage capacitor contained in each pixel in a condition that the reference voltage of the pixel is applied to the electrode of the storage capacitor. Hence, the voltage difference between the holding member and the pixel is reduced, so that secondary electrons emitted from a pixel near the holding member can be prevented from being absorbed to the holding member. Hence, all pixels in the whole test region can be tested uniformly and accurately independent of the position in the test region, that is, pixels both in the vicinity of the holding member and in a center of the flat panel display can be tested uniformly and accurately.

In addition, the apparatus for testing pixels of a flat panel display further comprises: a filter which is provided in a trajectory of secondary electrons emitted from the pixel and to which a second predetermined voltage is applied; wherein the voltage source unit further applies the first predetermined voltage to the filter.

According to the testing apparatus configured as described above, the filter to which the second predetermined voltage is applied is put in a trajectory of secondary electrons emitted from each pixel so that secondary electrons having energy of not higher than a predetermined value cannot be detected by the secondary electron detector. Hence, only secondary electrons having required energy can be detected by the secondary electron detector. Hence, pixel voltage waveform contrast can be made high on the basis of the amount of detected secondary electrons, so that a defect of each pixel can be detected more accurately.

In order to achieve the object, according to the invention, there is provided a method of testing pixels of a flat panel display, comprising: holding the flat panel display by a holding member; applying a first predetermined voltage to either the holding member or an electrode of a storage capacitor contained in each of the pixels in a condition that a reference voltage of the pixel is applied to the electrode of the storage capacitor; irradiating the flat panel display with an electron beam; and detecting secondary electrons emitted from each of the pixels of the flat panel display irradiated with the electron beam.

In the method of testing pixels of a flat panel display, preferably, the predetermined voltage applying step applies the first predetermined voltage as a plus value to the electrode of the storage capacitor. Further preferably, the predetermined voltage applying step applies the first predetermined voltage as a plus value to a data signal input terminal of a transistor contained in each of the pixels and to a switching control signal input terminal of the transistor.

In addition, in the method of testing pixels of a flat panel display, preferably, the predetermined voltage applying step applies the first predetermined voltage as a minus value to the holding member.

According to the testing method as described above, the flat panel display is held by the holding member. A first predetermined voltage is applied to either the holding member or the electrode of the storage capacitor contained in each pixel in a condition that the reference voltage of the pixel is applied to the electrode of the storage capacitor. The flat panel display is irradiated with an electron beam. Secondary electrons emitted from each of the pixels of the flat panel display irradiated with the electron beam are detected. Hence, the voltage difference between the holding member and the pixel is reduced, so that secondary electrons emitted from a pixel near the holding member can be prevented from being absorbed to the holding member. Hence, all pixels in the whole test region can be tested uniformly and accurately independent of the position in the test region, that is, pixels both in the vicinity of the holding member and in a center of the flat panel display can be tested uniformly and accurately.

DETAILED DESCRIPTION OF THE INVENTION

Embodiments of the invention will be described below in detail with reference to the drawings.

Figure 1A:
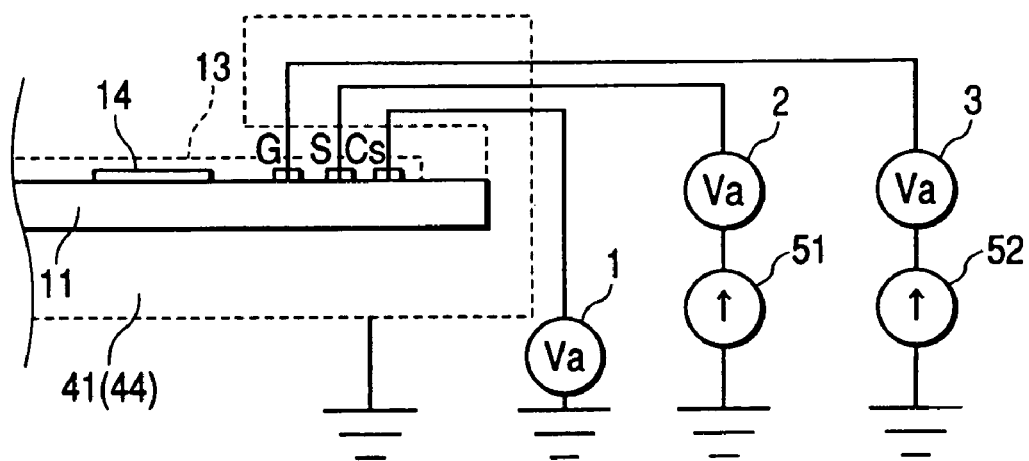
FIGS. 1A and 1B are schematic drawings showing an apparatus for testing pixels of a flat panel display according to a first embodiment of the invention.
Figure 1B:
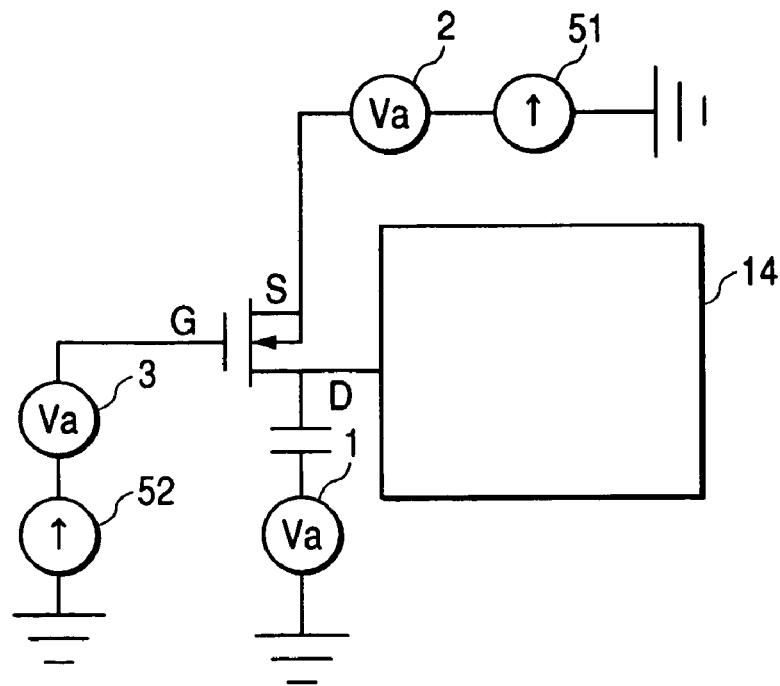

FIGS. 1A and 1B are schematic drawings showing an apparatus for testing pixels of a flat panel display according to a first embodiment of the invention. Incidentally, parts with configuration and operation the same as those in the related-art testing apparatus are referred to by numerals the same as those in the related-art testing apparatus, and description thereof will be omitted.

As shown in FIG. 1A, the testing apparatus according to the first embodiment has a palette 41, a prober 44, drive signal source units 51 and 52, and predetermined voltage source units 1, 2 and 3. The palette 41 holds a TFT substrate 11 thereon. The prober 44 is disposed on the TFT substrate 11. Drive signals are supplied to each pixel on the TFT substrate 11 through prober pins (not shown) of the prober 44. The palette 41 and the prober 44 are tightened to each other by fixing stutts such as bolts so that the palette 41 and the prober 44 are integrated with each other.

In the testing apparatus configured as described above, the palette 41 (and the prober 44) is electrically grounded. The predetermined voltage source unit 1 applies a predetermined voltage Va to a Cs electrode of each pixel on the TFT substrate 11 so that the voltage Va is used as a reference voltage of the TFT substrate 11. In this embodiment, the predetermined voltage Va has a plus value. The predetermined voltage Va is set in accordance with the voltage level of a predetermined voltage $V_S$ applied to a source electrode of each pixel on the TFT substrate 11.

The drive signal source units 51 and 52 supply drive signals to a source electrode S and a gate electrode G respectively contained in each pixel on the TFT substrate 11. Incidentally, the voltages of the drive signals are floated by a predetermined voltage Va given by the predetermined voltage source units 2 and 3. The predetermined voltage Va is a voltage equal in level to the predetermined voltage Va applied to the Cs electrode by the predetermined voltage source unit 1.

The influence of the voltage difference between the driven pixel and the prober on the amount of detected secondary electrons will be described below in the testing apparatus configured according to this embodiment.

Figure 6:
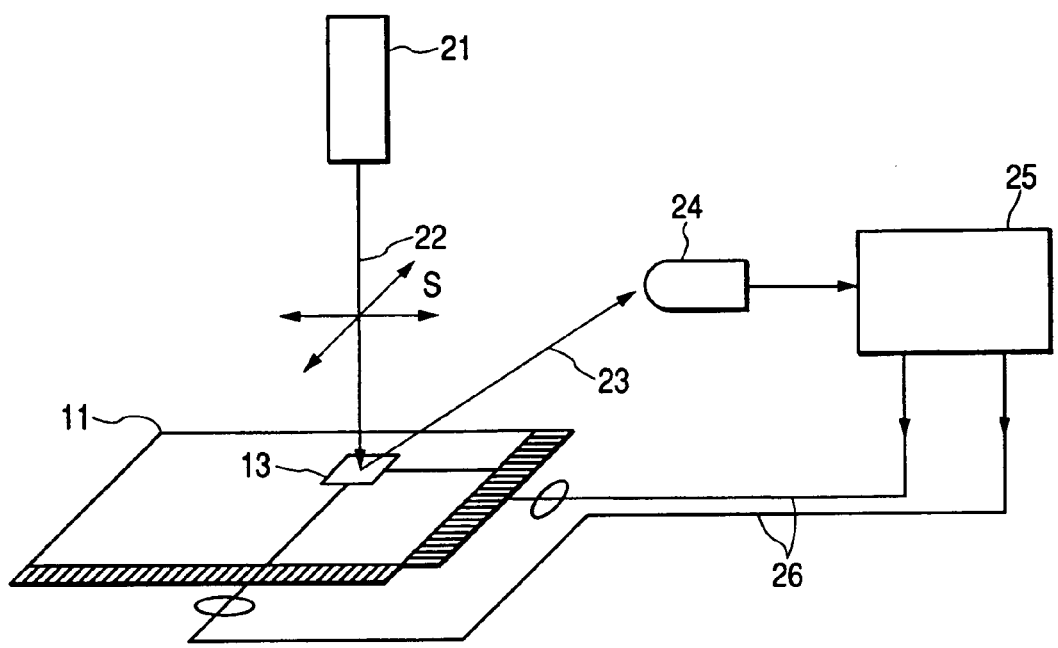
FIG. 6 is a drawing for explaining a TFT substrate testing method using a voltage contrast technique.
Figure 7A:
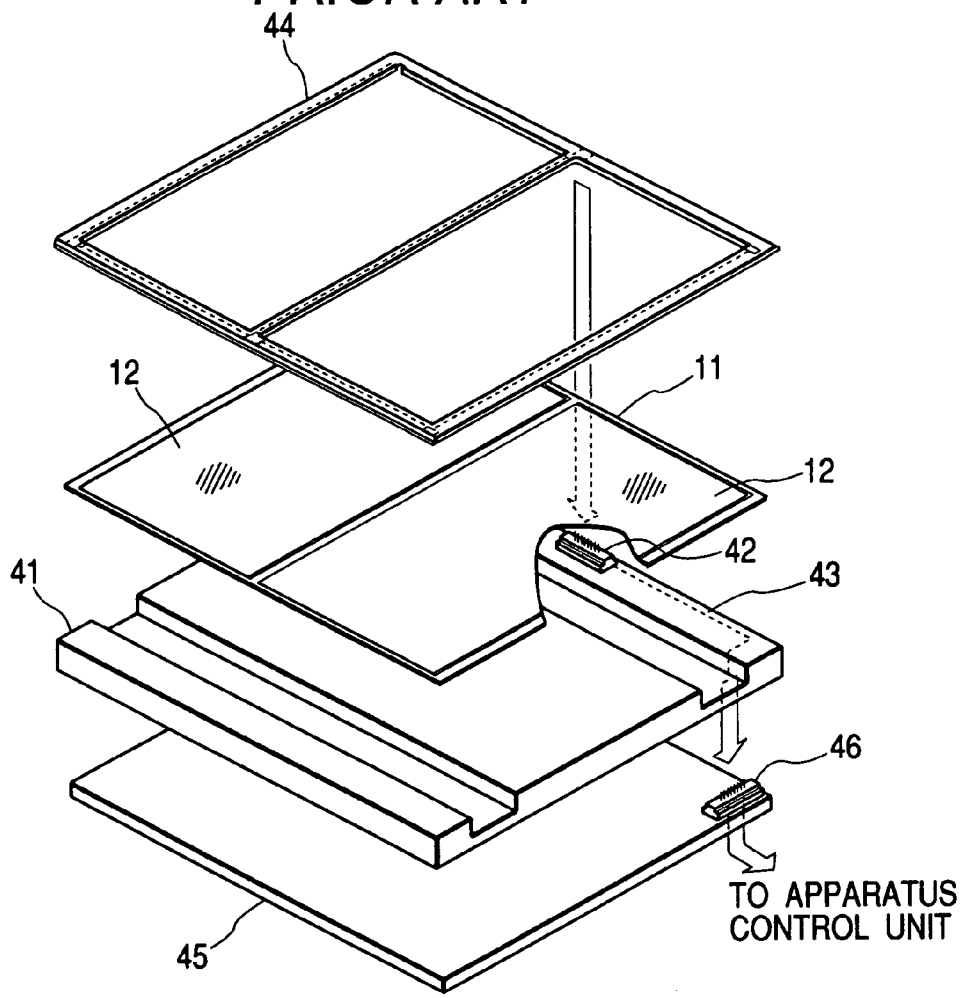
FIGS. 7A and 7B are perspective drawings showing a mode in which a TFT substrate is held between a palette for holding a TFT substrate and a prober for applying a TFT driving voltage.
Figure 7B:
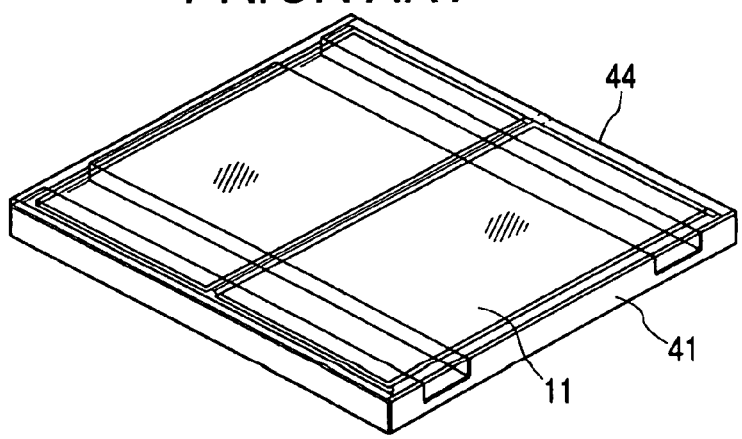
Figure 8:
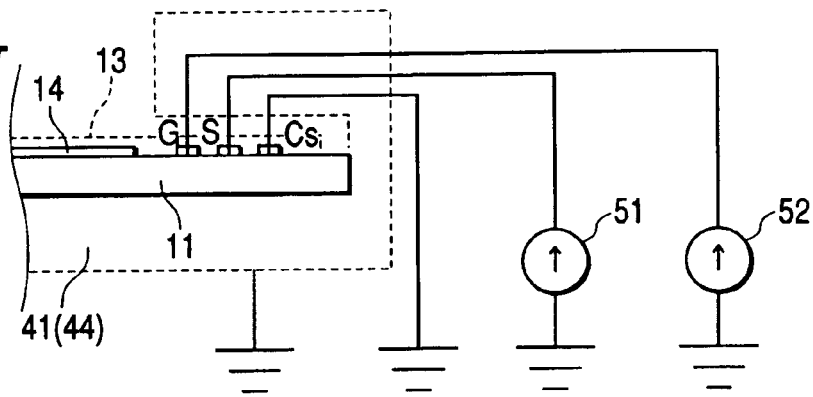
FIG. 8 is a schematic drawing showing a testing apparatus using a palette and a prober.

In a testing process, each pixel is driven positively or negatively in accordance with the drive signals floated by the predetermined voltage Va. The driven pixel is irradiated with an electron beam emitted from an electron beam source as shown in FIG. 6. Secondary electrons emitted from the pixel irradiated with the electron beam are detected by a secondary electron detector.

Figure 9A:
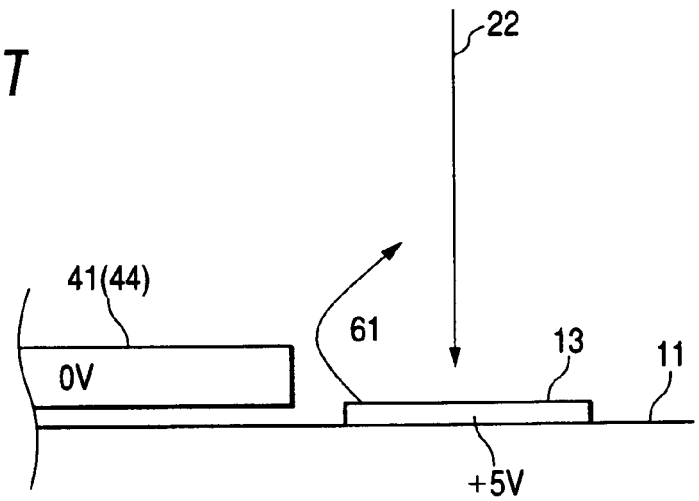
FIGS. 9A and 9B are schematic drawings for explaining a trajectory of secondary electron emission in accordance with the voltage of the TFT substrate.
Figure 9B:
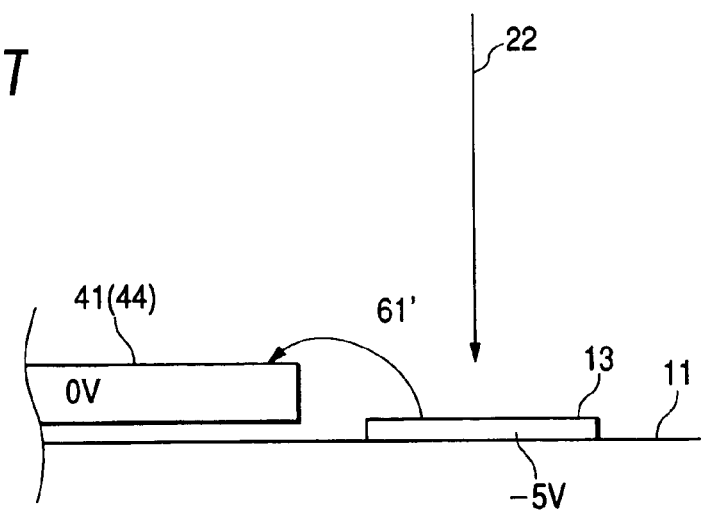

In the related-art testing apparatus, when each pixel on the TFT substrate 11 is negatively driven (e.g., each pixel is driven by a drive signal so that the predetermined voltage $V_S$ of the source electrode S of the pixel becomes −5 V) as shown in FIG. 9B, the voltage of the TFT substrate 11 becomes −5 V because the Cs electrode is grounded, whereas the voltage of the prober becomes 0 V because the prober 44 is grounded. Hence, the voltage difference between the prober 44 and a pixel near the prober 44 becomes 5 V (=0 V−(−5 V)). Hence, secondary electrons emitted from the pixel irradiated with the electron beam are attracted to the prober side lower in voltage.

On the other hand, in the testing apparatus according to this embodiment, the voltage of the TFT substrate 11 becomes −5 V+Va V because the predetermined plus voltage Va is applied to the Cs electrode, whereas the voltage of the prober becomes 0 V because the prober 44 is grounded. Hence, the voltage difference between the prober 44 and a pixel near the prober 44 becomes 5 V−Va V (=0 V−(−5 V+Va V)). Assuming now that the predetermined voltage $V_S$ of the source electrode S of each pixel is −5 V, then the preferred value of Va is about 5 V. Hence, in the testing apparatus according to this embodiment, the voltage difference between the prober 44 and a pixel near the prober 44 can be set at 0 V (=0 V−(−5 V+5 V)).

In the testing apparatus configured according to the first embodiment, when the voltage difference between the Cs electrode and the prober is set at zero, secondary electrons emitted from a pixel near the prober 44 on the basis of irradiation with an electron beam are not absorbed to the prober 44, so that secondary electrons can be detected sufficiently even in the vicinity of the prober. In this manner, there is little difference between the amount of detected secondary electrons emitted from a pixel near the prober 44 and the amount of detected secondary electrons emitted from a pixel located in the central portion of the TFT substrate 11. In addition, even in the case where a pixel defect is to be detected in a detected image obtained on the basis of the amount of detected secondary electrons, mistaking of a portion near the prober for a defect can be prevented from being caused by attraction of secondary electrons to the prober side, unlike the related art.

In this manner, the influence of the prober 44 on secondary electrons is reduced, so that the degree of freedom in the shape of the prober can be increased compared with the related art. For example, the thickness of the prober 44 can be increased. Hence, a prober high in mechanical strength can be used as the prober 44.

Although this embodiment has shown the case where a predetermined voltage Va is applied to the Cs electrode of each pixel to thereby set the voltage of the prober 44 at a different value from that of the reference voltage of the TFT substrate 11, the invention is not limited thereto. That is, the invention maybe also applied to the case where the Cs electrode is grounded while a predetermined voltage Va is applied to the prober 44. In this case, the predetermined voltage Va takes a minus value.

In this case, when each pixel on the TFT substrate 11 is negatively driven (e.g., each pixel is driven by a drive signal so that the predetermined voltage $V_S$ of the source electrode S of the pixel becomes −5 V), the voltage of the TFT substrate 11 becomes −5 V because the Cs electrode is grounded whereas the voltage of the prober becomes −Va V because the predetermined minus voltage Va is applied to the prober 44. Hence, the voltage difference between the prober 44 and a pixel near the prober 44 becomes −Va V+5V (=−Va V−(−5 V)). Assuming now that the predetermined voltage $V_S$ of the source electrode S of each pixel is −5 V, then the preferred value of Va is about 5 V. Hence, in the testing apparatus according to this embodiment, the voltage difference between the prober 44 and a pixel near the prober 44 can be set at 0 V (=−Va V+5 V).

An apparatus for testing pixels of a flat panel display according to a second embodiment of the invention will be described below.

Figure 2:
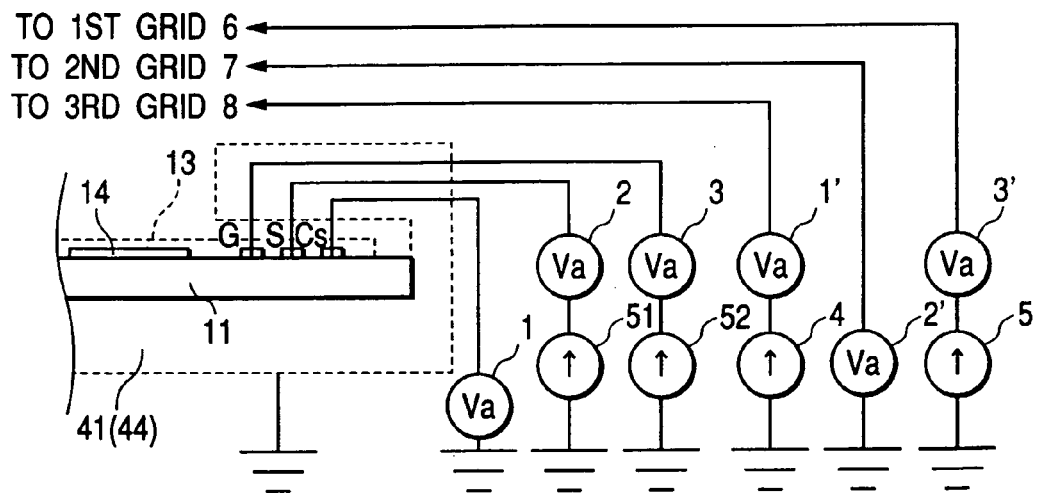
FIG. 2 is a schematic drawing showing an apparatus for testing pixels of a flat panel display according to a second embodiment of the invention.
Figure 3:
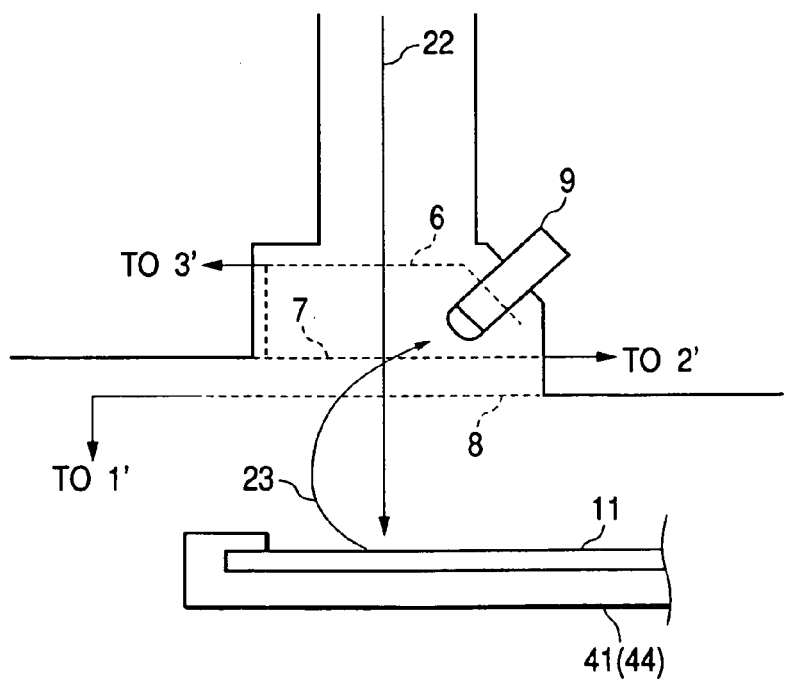
FIG. 3 is a schematic drawing showing an electron detecting mechanism in the second embodiment.

FIG. 2 is a schematic drawing showing an apparatus for testing pixels of a flat panel display according to the second embodiment of the invention. FIG. 3 is a schematic drawing showing an electron detector having filters in the second embodiment. Parts and devices the same as those in the first embodiment are referred to by numerals the same as those in the first embodiment and detailed description thereof will be omitted.

As shown in FIGS. 2 and 3, the testing apparatus according to the second embodiment has a palette 41, a prober 44, drive signal source units 51 and 52, predetermined voltage source units 1, 2, 3, 1', 2' and 3', a secondary electron detector 9, a first grid 6, a second grid 7, a third grid 8, a third grid voltage source unit 4, and a first grid voltage source unit 5.

The first grid 6 is provided to surround a range of detection of secondary electrons 23 by the secondary electron detector 9. The first grid voltage source unit 5 supplies a predetermined voltage to the first grid 6. An electron beam 22 is reflected by the TFT substrate 11 to thereby form high-energy reflected electrons. The high-energy reflected electrons are made incident on a wall surface of a high-vacuum chamber, so that secondary electrons may be emitted from the wall surface. The first grid 6, however, functions as a filter to prevent the secondary electrons from being detected by the secondary electron detector 9. When, for example, the first grid voltage source unit 5 applies a voltage of −50 V to the first grid 6, secondary electrons having energy of not higher than 50 eV from the wall surface of the high-vacuum chamber are removed, so that secondary electrons as noise incident on the secondary electron detector 9 are removed.

The second and third grids 7 and 8 are provided on an trajectory of secondary electrons 23 between the secondary electron detector 9 and the TFT substrate 11.

The third grid voltage source unit 4 applies a predetermined voltage to the third grid 8. The third grid 8 functions as a filter to detect only secondary electrons having required energy. When, for example, the third grid voltage source unit 4 applies a voltage of −5 V to the third grid 8, secondary electrons 23 having energy of lower than 5 eV are removed by the third grid 8, so that only secondary electrons 23 having energy higher than 5 eV are detected by the secondary electron detector 9. The second grid 7 is grounded. The second grid 7 functions as an auxiliary filter through which secondary electrons passed through the third grid 8 can be efficiently detected by the secondary electron detector.

In the testing apparatus according to this embodiment, the voltage of the Cs electrode is floated by a predetermined voltage Va in the same manner as in the first embodiment. Hence, the predetermined voltage source units 1' to 3' further apply predetermined voltages Va to the first, second and third grids 6 to 8 respectively.

In the testing apparatus configured as described above, the secondary electron detector 9 detects secondary electrons emitted from the TFT substrate, through the third grid 8 functioning as a filter and the second grid 7 functioning as an auxiliary filter. On this occasion, the amount of secondary electrons detected by the secondary electron detector 9 varies largely in accordance with the positive or negative driving of the TFT substrate because secondary electrons 23 having energy of not higher than 5 eV are removed by the third grid. As a result, pixel voltage waveform contrast based on the amount of secondary electrons becomes so high that a defect of each pixel can be detected more accurately.

Figure 4A:
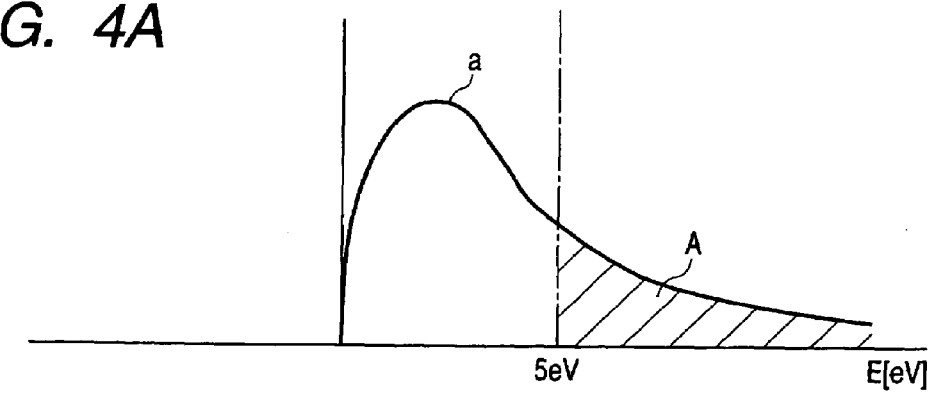
FIGS. 4A to 4C are graphs for explaining a filtering effect of a third grid.
Figure 4B:
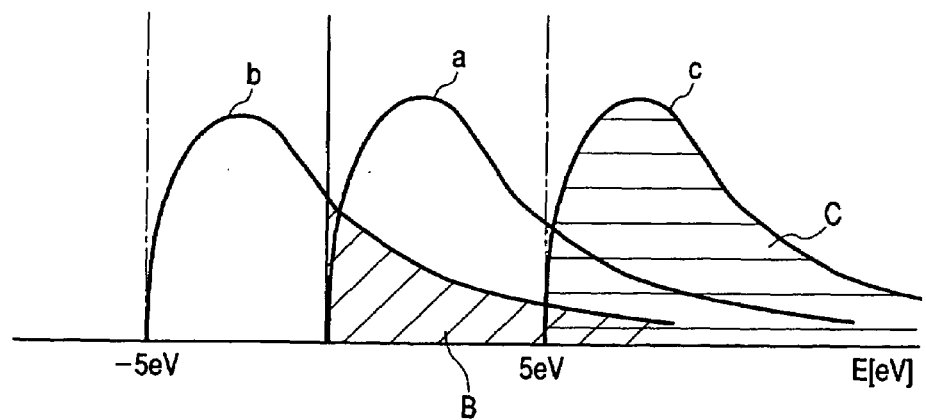
Figure 4C:
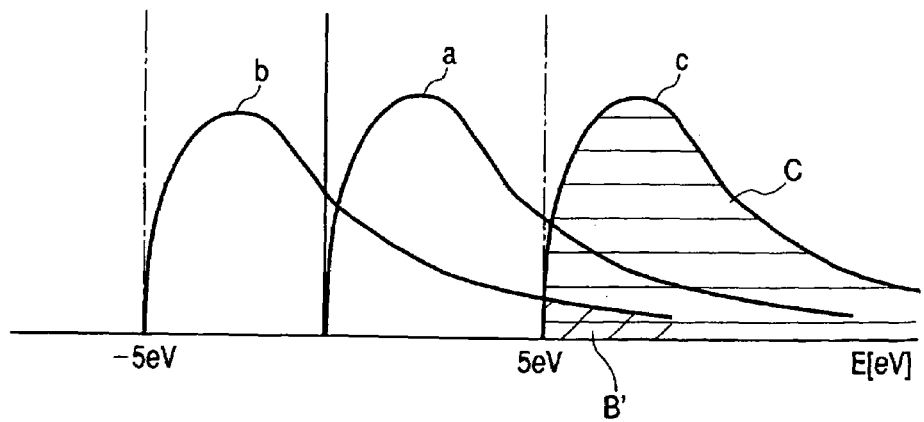
Figure 5:
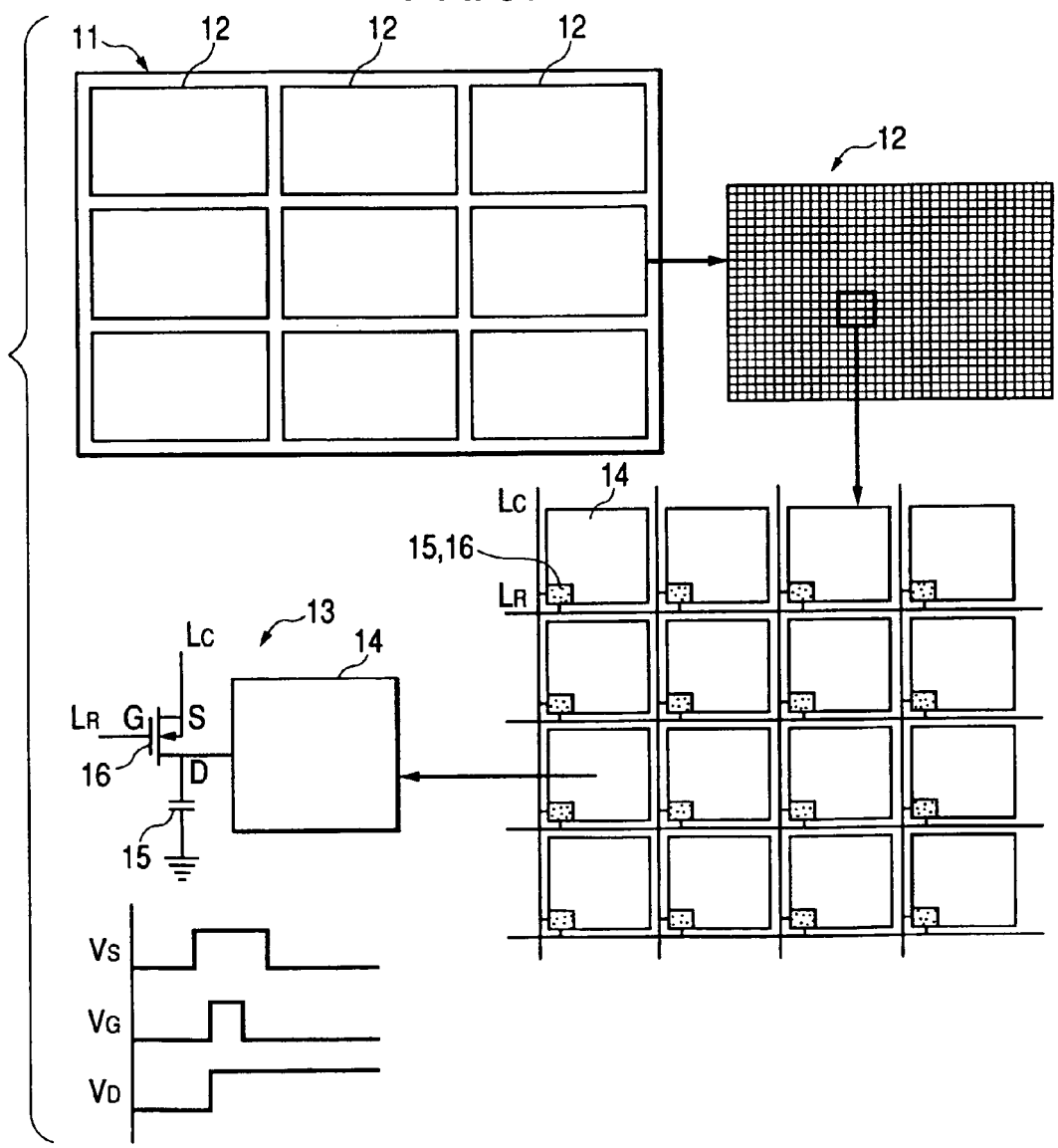
FIG. 5 is a schematic drawing showing a glass substrate having TFTs and pixel electrodes formed thereon.

The filtering function of the third grid 8 will be described below in detail with reference to FIGS. 4A to 4C. In FIGS. 4A to 4C, the horizontal axis shows energy E (eV) of secondary electrons 23 emitted from the TFT substrate 11 (pixel) and the vertical axis shows the number of secondary electrons 23 emitted from the TFT substrate 11. Incidentally, for the sake of convenience of description, the filtering function of the third grid 8 will be described in the case where the Cs electrode is grounded (i.e., the reference voltage of the TFT substrate 11 is 0 V).

First, when the TFT substrate 11 is not driven (i.e., the voltage of the TFT substrate 11 is 0 V), secondary electrons 23 emitted from the TFT substrate 11 in the testing process have an energy distribution a as shown in FIG. 4A. When the third grid voltage source unit 4 applies a voltage of −5 V to the third grid 8 in this condition, the secondary electron detector 9 detects only secondary electrons having energy represented by the hatched portion A in FIG. 4A.

Next, when the TFT substrate 11 is driven to +5 V or −5 V (i.e., the voltage of the TFT substrate 11 is +5 V or −5 V), the energy distribution of the secondary electrons 23 shifts left or right as shown in FIG. 4B. In FIG. 4B, the energy distribution b shows the energy distribution of secondary electrons 23 in the case where the voltage of the TFT substrate 11 is +5 V, while the energy distribution c shows the energy distribution of secondary electrons 23 in the case where the voltage of the TFT substrate 11 is −5 V.

When the third grid 8 is grounded in this condition, the secondary electron detector 9 detects secondary electrons having energy represented by the hatched portion B, from the TFT substrate 11 having a voltage of +5 V (energy distribution b). On the other hand, the secondary electron detector 9 detects secondary electrons having energy represented by the hatched portion C, from the TFT substrate 11 having a voltage of −5 V (energy distribution c). Hence, there is a large difference between the amount of detected secondary electrons in the case where the voltage of the TFT substrate 11 is +5 V and the amount of detected secondary electrons in the case where the voltage of the TFT substrate 11 is −5 V. Hence, pixel voltage waveform contrast based on the amount of detected secondary electrons 23 becomes so high that a defect of each pixel can be detected more accurately (voltage contrast effect).

When a voltage of −5 V is further applied to the third grid 8 in the condition that the TFT substrate 11 is driven to +5 V or −5 V, the secondary electron detector 9 detects secondary electrons having energy represented by the hatched portion B' in FIG. 4C, from the TFT substrate 11 having a voltage of +5V (energy distribution b). On the other hand, the secondary electron detector 9 detects secondary electrons 23 having energy represented by the hatched portion C, from the TFT substrate 11 having a voltage of −5 V (energy distribution c). Hence, there is a larger difference between the amount of detected secondary electrons in the case where the voltage of the TFT substrate 11 is +5 V and the amount of detected secondary electrons in the case where the voltage of the TFT substrate 11 is −5 V. Hence, pixel voltage waveform contrast based on the amount of detected secondary electrons 23 becomes so higher that a defect of each pixel can be detected more accurately (filtering effect).

The value of the voltage applied to the third grid 8 is set in accordance with the voltage level of the predetermined voltage $V_S$ applied to the source electrode S of each of pixels constituting the TFT substrate 11. When, for example, the predetermined voltage $V_S$ applied to the source electrode S is 5 V or −5 V, the preferred value of the voltage applied to the third grid 8 is −5 V.

In the testing apparatus configured according to the second embodiment, the voltage difference between the Cs electrode and the prober is made small. Hence, secondary electrons emitted from a pixel near the prober 44 by irradiation with an electron beam are hardly absorbed to the prober 44, so that secondary electrons can be detected sufficiently even in the vicinity of the prober. Hence, there is little difference between the amount of detected secondary electrons emitted from a pixel near the prober 44 and the amount of detected secondary electrons emitted from a pixel located in the central portion of the TFT substrate 11.

In addition, secondary electrons having energy of not higher than a predetermined value are removed by grids to which predetermined voltages are applied respectively, so that only secondary electrons having required energy are detected by the secondary electron detector. Hence, pixel voltage waveform contrast can be made high on the basis of the amount of detected secondary electrons, so that a defect of each pixel can be detected more accurately.

What is claimed is:

1. An apparatus for testing pixels of a flat panel display, comprising:
    an electron beam source for irradiating said flat panel display with an electron beam;
    a secondary electron detector for detecting secondary electrons emitted from each of said pixels of said flat panel display irradiated with said electron beam;
    a holding member for holding said flat panel display; and
    a voltage source unit for applying a first predetermined voltage to either said holding member or an electrode of a storage capacitor contained in each pixel in a condition that a reference voltage of said pixel is applied to said electrode of said storage capacitor, so as to reduce a voltage difference between the holding member and the pixel.

2. The apparatus for testing pixels of a flat panel display according to claim 1, wherein said voltage source unit applies said first predetermined voltage as a plus value to said electrode of said storage capacitor.

3. The apparatus for testing pixels of a flat panel display according to claim 2, wherein said voltage source unit applies said first predetermined voltage as a plus value to a data signal input terminal of a transistor contained in each pixel and to a switching control signal input terminal of said transistor.

4. The apparatus for testing pixels of a flat panel display according to claim 1, wherein said voltage source unit applies said first predetermined voltage as a minus value to said holding member.

5. The apparatus for testing pixels of a flat panel display according to claim 1, further comprising:
    a filter which is provided in a trajectory of secondary electrons emitted from said pixel and to which a second predetermined voltage is applied;
    wherein said voltage source unit further applies said first predetermined voltage to said filter.

6. A method of testing pixels of a flat panel display, comprising:
    holding said flat panel display by a holding member;
    applying a first predetermined voltage to either said holding member or an electrode of a storage capacitor contained in each of said pixels in a condition that a reference voltage of said pixel is applied to said electrode of said storage capacitor, so as to reduce a voltage difference between the holding member and the pixel;
    irradiating said flat panel display with an electron beam; and
    detecting secondary electrons emitted from each of said pixels of said flat panel display irradiated with said electron beam.

7. The method of testing pixels of a flat panel display according to claim 6, wherein the predetermined voltage applying step applies said first predetermined voltage as a plus value to said electrode of said storage capacitor.

8. The method of testing pixels of a flat panel display according to claim 7, wherein the predetermined voltage applying step applies said first predetermined voltage as a plus value to a data signal input terminal of a transistor contained in each of said pixels and to a switching control signal input terminal of said transistor.

9. The method of testing pixels of a flat panel display according to claim 6, wherein the predetermined voltage applying step applies said first predetermined voltage as a minus value to said holding member.

10. The apparatus for testing pixels of a flat panel display according to claim 1, wherein the holder comprises a palette for supporting the flat panel display and a prober for supplying drive signals to each pixel.

11. An apparatus for testing pixels of a flat panel display, comprising:
    an electron beam source for irradiating said flat panel display with an electron beam;
    a secondary electron detector for detecting secondary electrons emitted from each of said pixels of said flat panel display irradiated with said electron beam;
    a holding member for holding said flat panel display;
    a voltage source unit for applying a first predetermined voltage to either said holding member or an electrode of a storage capacitor contained in each pixel in a condition that a reference voltage of said pixel is applied to said electrode of said storage capacitor, so as to reduce a voltage difference between the holding member and the pixel; and
    a filter which is provided in a trajectory of secondary electrons emitted from said pixel and to which a second predetermined voltage is applied;
    wherein said voltage source unit further applies said first predetermined voltage to said filter;
    wherein the filter comprises a grid that removes secondary electrons below a predetermined energy indicating noise from being detected by the secondary electron detector, thereby improving pixel voltage waveform contrast and improving detection of pixel defect.

12. The method of testing pixels of a flat panel display according to claim 6, further comprising a step of removing secondary electrons below a predetermined energy indicating noise from being detected by the secondary electron detector, thereby improving pixel voltage waveform contrast and improving detection of pixel defect.

* * * * *

UNITED STATES PATENT AND TRADEMARK OFFICE
CERTIFICATE OF CORRECTION

PATENT NO. : 7,012,583 B2
DATED : March 14, 2006
INVENTOR(S) : Toro-Lira et al.

It is certified that error appears in the above-identified patent and that said Letters Patent is hereby corrected as shown below:

Column 11,
Line 14, after "display," insert -- said holding member comprising a prober for supplying drive signals to each pixel --.
Line 45, after "member;" insert -- said holding member comprising a prober for supplying drive signals to each pixel --.

Column 12,
Line 18, after "display", delete "and a prober for supplying drive signals to each pixel".

Signed and Sealed this

Sixteenth Day of May, 2006

JON W. DUDAS
*Director of the United States Patent and Trademark Office*